(12) United States Patent
Cusin et al.

(10) Patent No.: US 9,139,925 B2
(45) Date of Patent: Sep. 22, 2015

(54) MOULD FOR GALVANOPLASTY AND METHOD OF FABRICATING THE SAME

(71) Applicant: Nivarox-FAR S.A., Le Locle (CH)

(72) Inventors: Pierre Cusin, Villars-Burquin (CH); Clare Golfier, La Neuveville (CH); Jean-Philippe Thiebaud, Cudrefin (CH)

(73) Assignee: Nivarox-FAR S.A., Le Locle (CH)

( * ) Notice: Subject to any disclaimer, the term of this patent is extended or adjusted under 35 U.S.C. 154(b) by 370 days.

(21) Appl. No.: 13/644,215

(22) Filed: Oct. 3, 2012

(65) Prior Publication Data

US 2013/0213800 A1    Aug. 22, 2013

Related U.S. Application Data

(62) Division of application No. 12/723,191, filed on Mar. 12, 2010, now Pat. No. 8,512,539.

(30) Foreign Application Priority Data

Mar. 13, 2009   (EP) ..................................... 09155125

(51) Int. Cl.
*C25D 1/10* (2006.01)
*C25D 1/00* (2006.01)
(Continued)

(52) U.S. Cl.
CPC ................ *C25D 1/10* (2013.01); *B81C 99/009* (2013.01); *C25D 17/00* (2013.01); *B81B 2201/035* (2013.01)

(58) Field of Classification Search
CPC .......... C25D 1/10; C25D 17/00; C25D 17/06; C25D 1/00; B81C 2201/034; B29C 45/26

USPC ..................... 204/281; 205/70, 233
See application file for complete search history.

(56) References Cited

U.S. PATENT DOCUMENTS 5,234,571 A    8/1993 Noeker
5,529,681 A    6/1996 Reinecke et al.
(Continued)

FOREIGN PATENT DOCUMENTS

DE    40 01 399 C1    7/1991
EP    0 547 371 A1    6/1993
(Continued)

OTHER PUBLICATIONS

Petersen et al. (Proceeding of the IEEE, vol. 70, No. 5, 1982, pp. 420-457).*

(Continued)

*Primary Examiner* — Luan Van
*Assistant Examiner* — Alexander W Keeling
(74) *Attorney, Agent, or Firm* — Griffin & Szipl, P.C.

(57) ABSTRACT

The invention concerns the field of micromechanical parts, in particular, for timepiece movements. The invention relates to a method of fabricating a mold that includes the following steps: (a) providing a substrate that has a top layer and a bottom layer made of electrically conductive, micromachinable material, and secured to each other by an electrically insulating, intermediate layer; (b) etching at least one pattern in the top layer as far as the intermediate layer to form at least one cavity in the mold; (c) coating the top part of the substrate with an electrically insulating coating; and (d) directionally etching the coating and the intermediate layer to limit the presence thereof exclusively at each vertical wall formed in the top layer.

6 Claims, 4 Drawing Sheets

(51) Int. Cl.
*C25D 17/00* (2006.01)
*B81C 99/00* (2010.01)

(56) References Cited

U.S. PATENT DOCUMENTS

| | | | |
|---|---|---|---|
| 5,944,974 | A | 8/1999 | Fahrenberg et al. |
| 6,214,245 | B1 | 4/2001 | Hawkins et al. |
| 7,052,117 | B2 * | 5/2006 | Bibl et al. ............... 347/68 |
| 7,448,277 | B2 | 11/2008 | Gogoi et al. |
| 7,887,995 | B2 | 2/2011 | Niwa et al. |
| 7,960,090 | B2 | 6/2011 | Terasaki et al. |
| 8,021,534 | B2 | 9/2011 | Niwa et al. |
| 8,148,049 | B2 | 4/2012 | Murayama et al. |
| 8,197,029 | B2 * | 6/2012 | Debrabander et al. ......... 347/44 |
| 2004/0191704 | A1 | 9/2004 | Nishi et al. |
| 2005/0099467 | A1 * | 5/2005 | Bibl et al. ............... 347/68 |
| 2006/0160027 | A1 | 7/2006 | Niwa et al. |
| 2010/0230290 | A1 | 9/2010 | Cusin et al. |

FOREIGN PATENT DOCUMENTS

| | | |
|---|---|---|
| EP | 1 462 859 A2 | 9/2004 |
| EP | 1 681 375 A1 | 7/2006 |
| EP | 2 060 534 A1 | 5/2009 |
| JP | 2005-256110 A | 9/2005 |

OTHER PUBLICATIONS

Niwa et al (Machine translation of JP 2006-169620.*
English translation of Chinese office action received May 9, 2013 in corresponding application 201010134011.0.
Yonehara, Takao et al., ELTRAN®; Novel SOI Wafer Technology 4 JSAP International 10-16 (2001).
European Search Report issued corresponding application No. EP09155125, completed Sep. 11, 2009.
Office Action issued in U.S. Appl. No. 12/723,147, on Jun. 8, 2012.

* cited by examiner

MOULD FOR GALVANOPLASTY AND METHOD OF FABRICATING THE SAME

This application is a divisional of U.S. patent application Ser. No. 12/723,191, filed Mar. 12, 2010, which claims priority from European Patent Application No. 09155125.9 filed Mar. 13, 2009, the entire disclosures of which are incorporated herein by reference.

FIELD OF THE INVENTION

The invention relates to a mould for fabricating a micromechanical part using galvanoplasty and the method of fabricating said mould.

BACKGROUND OF THE INVENTION

Galvanoplasty has been used and known for a long time. LIGA type methods (a well know abbreviation for the German term "röntgenLIthographie, Galvanoformung & Abformung") are more recent. They consist in forming a mould by photolithography using a photosensitive resin, and then, by galvanoplasty, growing a metal deposition, such as nickel, therein. The precision of LIGA techniques is much better than that of a conventional mould, obtained, for example, by machining. This precision thus allows the fabrication of micromechanical parts, particularly for timepiece movements, which could not have been envisaged before.

However, these methods are not suitable for micromechanical parts with a high slenderness ratio, such as a coaxial escape wheel made of nickel-phosphorus containing, for example 12% phosphorus. Electrolytic depositions of this type of part delaminate during plating, because of internal stresses in the plated nickel-phosphorus, which cause it to split away at the interface with the substrate.

SUMMARY OF THE INVENTION

It is an object of the present invention to overcome all or part of the aforementioned drawbacks, by proposing an alternative mould that offers at least the same fabrication precision and allows fabrication of parts with several levels and/or a high slenderness ratio.

The invention therefore concerns a method of fabricating a mould that includes the following steps:
a) providing a substrate that has a top layer and a bottom layer made of electrically conductive, micromachinable material, and secured to each other by an electrically insulating, intermediate layer;
b) etching at least one pattern in the top layer as far as the intermediate layer so as to form at least one cavity in said mould;
c) coating the top part of said substrate with an electrically insulating coating;
d) directionally etching said coating and said intermediate layer to limit their presence exclusively at each vertical wall formed in said top layer.

According to other advantageous features of the invention:
a second pattern is etched in step b) to form at least one recess that communicates with said at least one cavity, providing said top layer with a second level;
after step d), a part is mounted to form at least one recess that communicates with said at least one cavity, providing said mould with a second level;
the method includes the final step e): mounting a rod in said at least one cavity to form a hole in the future part made in said mould;

step b) includes phase f): structuring at least one protective mask on the conductive top layer, phase g): performing an anisotropic etch of said top layer on the parts that are not coated by said at least one protective mask and phase h): removing the protective mask;
after the preceding steps, the method includes step a'): depositing an electrically conductive material in the bottom of said at least one cavity, b'): etching a pattern in the bottom layer as far as the deposition of said conductive material, to form a least one cavity in said mould and c'): coating the whole assembly with a second, electrically insulating coating;
after step c'), the method includes step d'): directionally etching said second coating to limit the presence thereof exclusively at each vertical wall formed in said bottom layer;
a second pattern is etched during step b') to form at least one recess that communicates with said at least one cavity, providing said bottom layer with a second level;
a part is mounted after step d') to form at least one recess that communicates with said at least one cavity, providing said mould with a second level;
the method includes the final step e'): mounting a rod in said at least one cavity in the bottom layer to form a hole in the future part made in said mould;
step b') includes phase f'): structuring at least one protective mask on the conductive top layer, g'): performing an anisotropic etch of said top layer on the parts that are not covered by said at least one protective mask and h'): removing the protective mask;
several masks are fabricated on the same substrate;
the conductive layers include a doped, silicon-based material.

The invention also relates to a method of fabricating a micromechanical part using galvanoplasty, characterized in that it includes the following steps:
i) fabricating a mould in accordance with the method of one of the preceding variants;
j) performing an electrodeposition by connecting the electrode to the conductive bottom layer of the substrate to form said part in said mould;
k) releasing the part from said mould.

Finally, the invention relates to a mould for fabricating a micromechanical part using galvanoplasty, characterized in that it includes a substrate that has a top layer and a bottom layer, which are electrically conductive and secured to each other by an electrically insulating, intermediate layer, wherein the top layer has at least one cavity, which reveals part of the bottom layer of said substrate and has electrically insulating walls, allowing an electrolytic deposition to be grown in said at least one cavity.

According to other advantageous features of the invention:
the top layer also has at least one recess that communicates with said at least one cavity and has electrically insulating walls for continuing the electrolytic deposition in said at least one recess after said at least one cavity has been filled;
the bottom layer includes at least one cavity that reveals part of the electrically conductive layer of said substrate and has electrically insulating walls, allowing an electrolytic deposition to be grown in said at least one cavity in the bottom layer;
the bottom layer also has at least one recess that communicates with said at least one cavity in the bottom layer and has electrically insulating walls for continuing the electrolytic deposition in said at least one recess, after said at least one cavity in the bottom layer has been filled.

BRIEF DESCRIPTION OF THE DRAWINGS

Other features and advantages will appear more clearly from the following description, given by way of non-limiting illustration, with reference to the annexed drawings, in which.

DETAILED DESCRIPTION OF PREFERRED EMBODIMENTS

Figure 13:
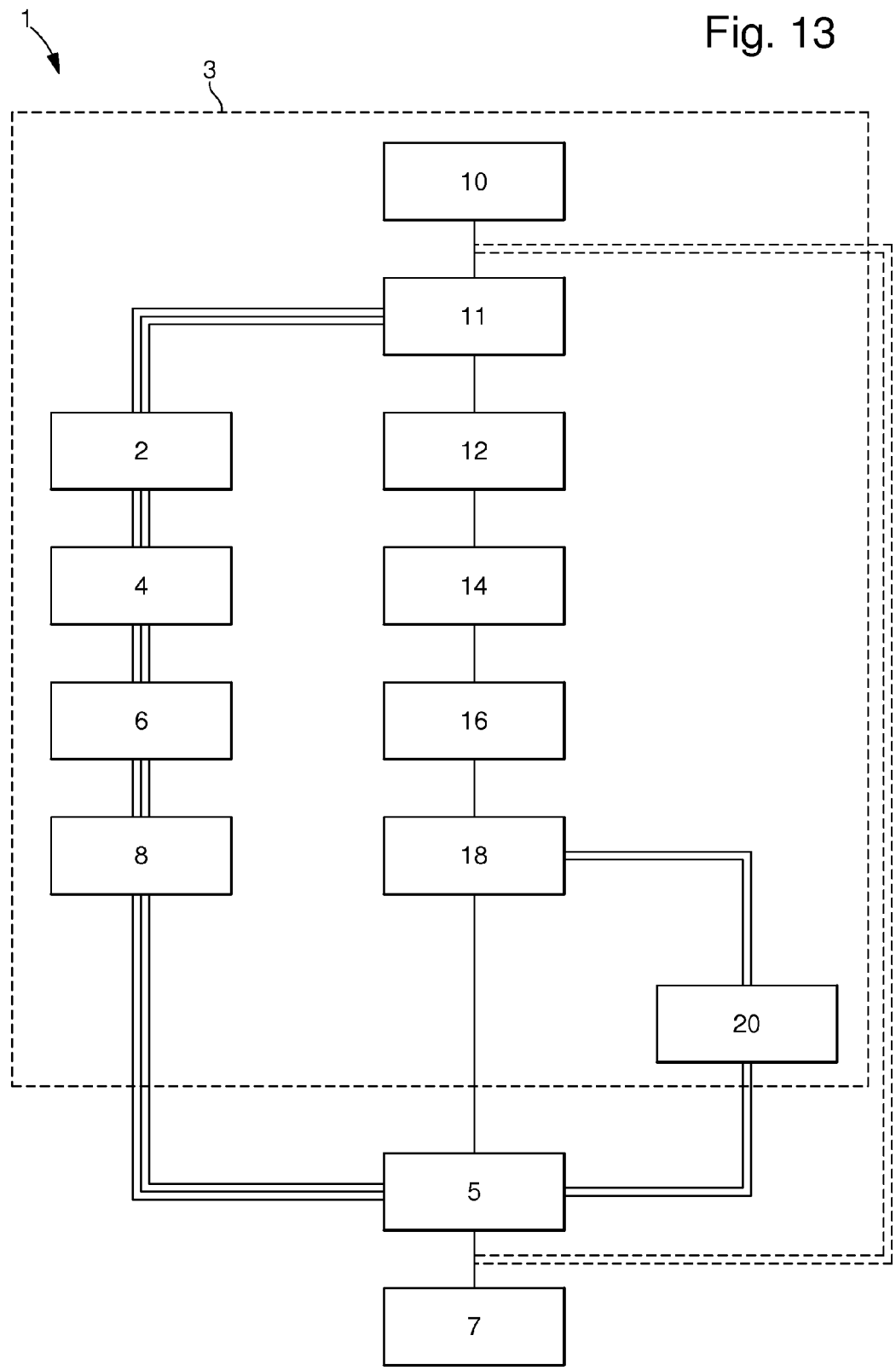
FIG. 13 is a flow chart of a method of fabricating a micromechanical part in accordance with the invention.
Figure 14:
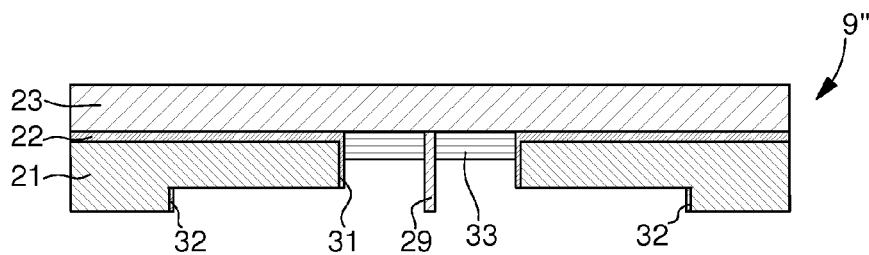
FIGS. 14 to 19 are diagrams of the successive steps of a method of fabricating a micromechanical part in accordance with a variant of the invention.

As FIG. 13 shows, the invention relates to a method 1 of fabricating a micromechanical part 41, 41', 41" using galvanoplasty. Method 1 preferably includes a method 3 of fabricating a mould 39, 39', 39" followed by galvanoplasty step 5 and step 7 of releasing part 41, 41', 41" from said mould.

Mould fabrication method 3 includes a series of steps for fabricating a mould 39, 39', 39" that preferably includes silicon-based materials.

A first step 10 of method 3 consists in taking a substrate 9, 9' that includes a top layer 21, 21' and a bottom layer 23, 23', which are made of electrically conductive, micromachinable material and secured to each other by an electrically conductive, intermediate layer 22, 22', as illustrated in FIGS. 1 to 8.

Preferably, substrate 9, 9' is a S.O.I. (Silicon On Insulator). Moreover, top and bottom layers 21, 21' and 23, 23' are made of crystalline silicon, sufficiently doped to be electrically conductive and the intermediate layer is made of silicon dioxide.

According to the invention, method 3 includes two distinct embodiments after step 11, respectively represented by a triple line and a single line in FIG. 13.

Figure 1:
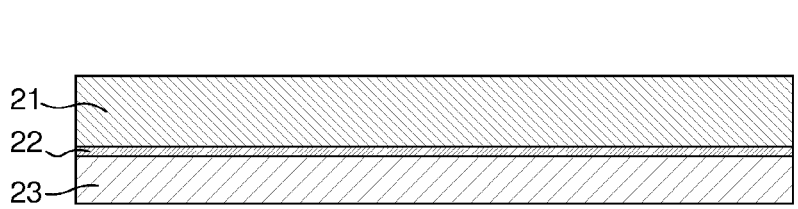
FIGS. 1 to 7 are diagrams of the successive steps of a method of fabricating a micromechanical part in accordance with a first embodiment of the invention.
Figure 2:
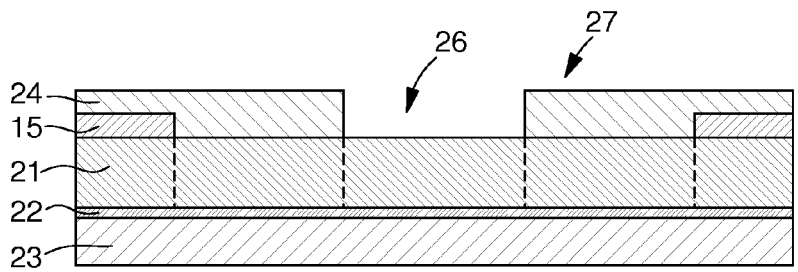

According to a first embodiment, in step 11, protective masks 15, then 24, are structured on conductive top layer 21 as illustrated in FIG. 2. As FIG. 2 also shows, mask 15 has at least one pattern 27 which does not cover top layer 21. Moreover, mask 24, which preferably totally covers mask 15, has at least one pattern 26, which does not cover top layer 21.

By way of example, mask 15 can be made by depositing a silicon oxide layer to form said mask to a predetermined depth. Next, mask 24 can, for example, be obtained by photolithography, using a photosensitive resin to cover mask 15.

According to the first embodiment shown in a triple line in FIG. 13, in a third step 2, top layer 21 is etched to reveal intermediate layer 22. According to the invention, etching step 2 preferably includes an anisotropic dry attack of the Deep Reactive Ion Etching type (DRIE).

First of all in step 2, an anisotropic etch is performed in top layer 21 in pattern 26 of mask 24. This etch is the start of the etching of at least one cavity 25 in top layer 21 over one part of the thickness thereof. Secondly, mask 24 is removed, then a second anisotropic etch is performed in pattern 27 of mask 15 that is still present on top layer 21. The second etch continues the etching of said at least one cavity 25, but also starts the etching of at least one recess 28, which communicates with said at least one cavity 25, but has a larger section.

Figure 3:
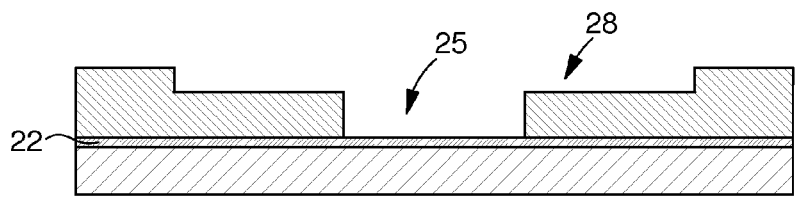

In a fourth step 4, mask 15 is removed. Thus, as FIG. 3 shows, at the end of fourth step 4, the entire thickness of top layer 21 is etched with said at least one cavity 25 and a part of the thickness thereof is etched with said at least one recess 28.

Figure 4:
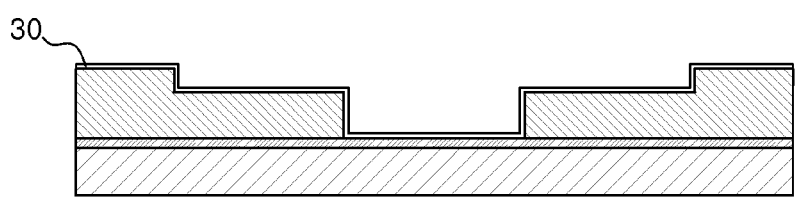

In a fifth step 6, an electrically insulating coating 30 is deposited, covering the entire top of substrate 9, as illustrated in FIG. 4. Coating 30 is preferably obtained by oxidising the top of the etched top layer 21 and intermediate layer 22.

In a sixth step 8, a directional etch of coating 30 and intermediate layer 22 is performed. Step 8 is for limiting the presence of the insulating layers exclusively at each vertical wall formed in top layer 21, i.e. walls 31 and 32 respectively of said at least one cavity 25 and said at least one recess 28. According to the invention, during a directional or anisotropic etch, the vertical component of the etch phenomenon is favoured relative to the horizontal component, by modulating, for example, the chamber pressure (very low working pressure), in a RIE reactor. This etch may be, by way of example, ion milling or sputter etching.

Figure 5:
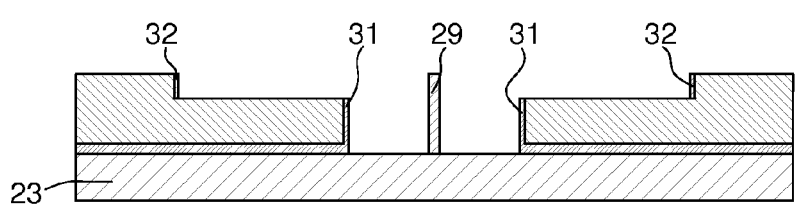

By performing step 8, as illustrated in FIG. 5, it is clear that the bottom of cavity 25 reveals the electrically conductive, bottom layer 23 and that the bottom of recess 28 reveals top layer 21, which is also conductive.

In order to improve the adhesion of the future galvanoplasty, an adhesion layer can be provided on the bottom of each cavity 25 and/or on the bottom of each recess 28. The adhesion layer could thus consist of a metal, such as the alloy CrAu.

Preferably, during sixth step 8, as illustrated in FIG. 5, a rod 29 is mounted to form the shaft hole 42 for micromechanical part 41 immediately during galvanoplasty step 5. This not only has the advantage of avoiding the need to machine part 41 once the galvanoplasty has finished, but also means that an inner section of any shape, whether uniform or not, can be made over the entire height of hole 42. Preferably, rod 29 is obtained, for example, via a photolithographic method using a photosensitive resin.

In the first embodiment, after step 8, method 3 of fabricating mould 39 is finished and method 1 of fabricating the micromechanical part continues with galvanoplasty step 5 and step 7 of releasing part 41 from mould 39.

Figure 6:
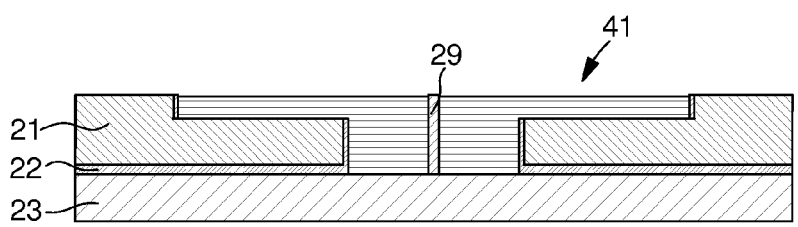

Galvanoplasty step 5 is achieved by connecting the deposition electrode to bottom layer 23 of mould 39 to grow, firstly, an electrolytic deposition in cavity 25 of said mould, and then exclusively in a second phase, in recess 28, as illustrated in FIG. 6.

Indeed, advantageously, according to the invention, when the electrolytic deposition is flush with the top part of cavity 25, it electrically connects top layer 21, possibly by the adhesion layer thereof, which enables the deposition to continue growing over the whole of recess 28. Advantageously, the invention enables parts 41 with a high slenderness ratio to be made, i.e. wherein the section of cavity 25 is much smaller than that of recess 28. This avoids delamination problems, even with a nickel-phosphorus material, containing, for example, 12% phosphorus.

Owing to the use of silicon for conductive layers 21, 23, and possibly for their adhesion layer, delamination phenomena at the interfaces decreases, which avoids splitting caused by internal stresses in the electrodeposited material.

Figure 7:
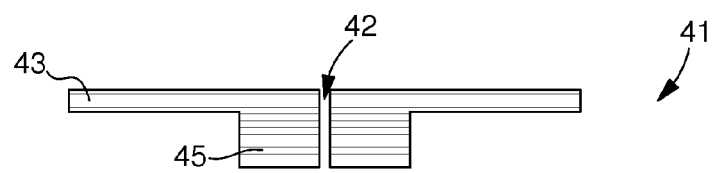

According to the first embodiment, fabrication method 1 ends with step 7, in which part 41, formed in cavity 25 and then in recess 28, is released from mould 39. Release step 7 can, for example, be achieved by etching layers 23 and 21. According to this first embodiment, it is clear, as illustrated in FIG. 7, that the micromechanical part 41 obtained has two levels 43, 45, each of different shape and perfectly independent thickness and including a single shaft hole 42.

This micromechanical part 41 could, for example, be a coaxial escape wheel or an escape wheel 43-pinion 45 assembly with geometrical precision of the order of a micrometer, but also ideal referencing, i.e. perfect positioning between said levels.

Figure 8:
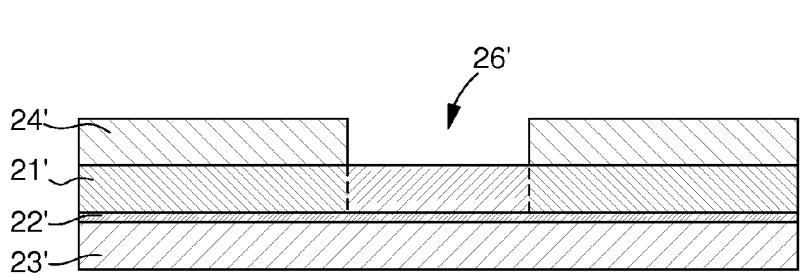
FIGS. 8 to 12 are diagrams of the successive steps of a method of fabricating a micromechanical part in accordance with a second embodiment of the invention.

According to a second embodiment of the invention, method 3 has a second step 11, consisting in structuring at least one protective mask 24' on the conductive top layer 21' as illustrated in FIG. 8. As FIG. 8 also shows, mask 24' includes at least one pattern 26', which does not cover top part 21'. This mask 24' can, for example, be obtained by photolithography using a photosensitive resin.

In a third step 12, top layer 21' is etched until it reveals intermediate layer 22'. According to the invention, etching step 12 preferably includes a dry anisotropic attack of the deep reactive ion etching type (DRIE). The anisotropic etch is performed on top layer 21' in pattern 26' of mask 24'.

Figure 9:
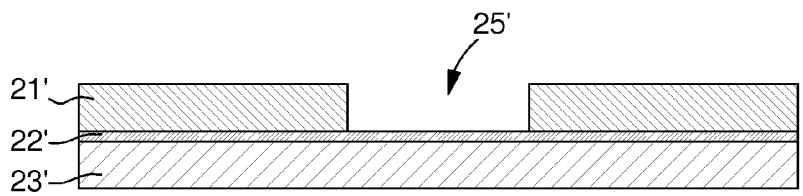

In a fourth step 14, mask 24' is removed. Thus, as FIG. 9 shows, at the end of fourth step 14, the entire thickness of top layer 21' is etched with at least one cavity 25'.

Figure 10:
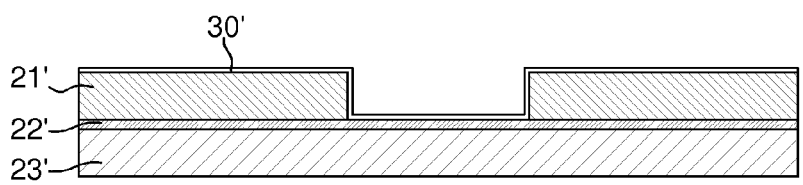

In a fifth step 16, an electrically insulating coating 30' is deposited, covering the whole top of substrate 9' as illustrated in FIG. 10. Coating 30' is preferably obtained by oxidising the top of the etched top layer 21' and intermediate layer 22'.

Figure 11:
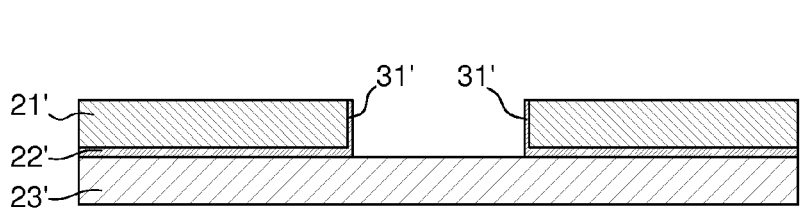

According to a sixth step 18, coating 30' and intermediate layer 22' are directionally etched. Step 18 is for limiting the presence of insulating layers exclusively at each vertical wall formed in top layer 21', i.e. walls 31' of said at least one cavity 25'. By performing this step 18 and as illustrated in FIG. 11, it is clear that the bottom of cavity 25' reveals the electrically conductive bottom layer 23' and the top of top layer 21', which is also conductive.

As in the first embodiment, in order to improve the adhesion of the future galvanoplasty, an adhesion layer can be provided on the bottom of each cavity 25' and/or on the top of top layer 21'. The adhesion layer could then consist of a metal, such as the alloy CrAu.

During sixth step 18, as explained for the first embodiment of FIGS. 1 to 7, a rod can be mounted to form the shaft hole for the micromechanical part straight away in galvanoplasty step 5, with the same advantages indicated above.

In the second embodiment, after step 18, method 3 of fabricating mould 39' ends and method 1 of fabricating the micromechanical part continues with galvanoplasty step 5 and step 7 of releasing the part from mould 39'.

Galvanoplasty step 5 is performed by connecting the deposition electrode to bottom layer 23' of mould 39' to grow an electrolytic deposition in cavity 25' of mould 39'.

According to the second embodiment, fabrication method 1 ends with step 7, which is similar to that explained in the first embodiment, and in which the part formed in cavity 25' is released from mould 39'. According to this second embodiment, it is clear that the micromechanical part obtained has a single level of identical shape throughout the entire thickness thereof and it may contain a shaft hole.

This micromechanical part could, for example, be an escape wheel, or escape pallets or even a pinion with geometrical precision of the order of a micrometer.

Figure 12:
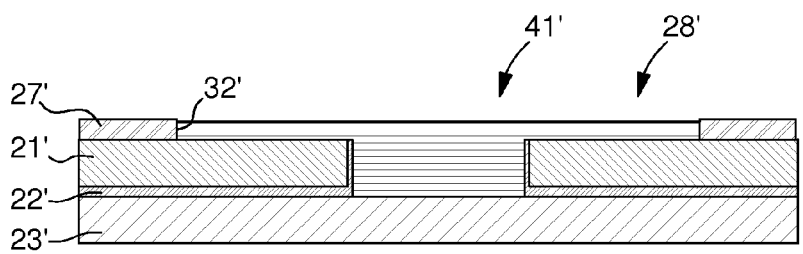

According to an alternative of this second embodiment illustrated by a double line in FIG. 13, after step 18, method 3 of fabricating mould 39' includes an additional step 20 for forming at least a second level in mould 39' as illustrated in FIG. 12. Thus, the second level is made by mounting a part 27', which includes electrically insulating walls 32', on top layer 21', which was not removed during step 12.

Preferably, the added part 27' forms at least one recess 28' of larger section than the removed parts 25', for example, via a photolithographic method using a photosensitive resin. However, part 27' could also include an insulating, silicon-based material that is pre-etched and then secured to conductive layer 21'.

Consequently, according to the alternative of the second embodiment, after step 20, method 3 of fabricating mould 39' ends and method 1 of fabricating the micromechanical part continues with galvanoplasty step 5 and step 7 of releasing part 41' from mould 39'.

Galvanoplasty step 5 is performed by connecting the deposition electrode to bottom layer 23' of mould 39' in order, firstly, to grow an electrolytic deposition in cavity 25' of said mould, then, exclusively in a second phase, in recess 28', as illustrated in FIG. 12.

Indeed, advantageously, according to the invention, when the electrolytic deposition is flush with the top part of cavity 25', it electrically connects top layer 21', possibly by the adhesion layer thereof, which enables the deposition to continue growing over the whole of recess 28'. Advantageously, the invention enables parts 41' with a high slenderness ratio to be made, i.e. wherein the section of cavity 25' is much smaller than that of recess 28'. This avoids delamination problems even with a nickel-phosphorus material, containing, for example, 12% phosphorus.

Owing to the use of silicon for conductive layers 21', 23', and possibly for their adhesion layer, delamination phenomena at the interfaces decreases, which avoids splitting caused by internal stresses in the electrodeposited material.

According to the second embodiment alternative, fabrication method 1 ends with step 7, as explained in the first embodiment, in which part 41' formed in mould 39' is released. It is clear, as illustrated in FIG. 12, that the micromechanical part 41' obtained has two levels, each of different shape and perfectly independent thickness and they may include a single shaft hole. This micromechanical part 41' can consequently have the same shape as part 41 obtained with the first embodiment and it can therefore have geometrical precision of the order of a micrometer, but also ideal referencing, i.e. perfect positioning between said levels.

According to a variant (illustrated in double dotted lines in FIG. 13) of the two embodiments of method 1 seen in FIGS. 14 to 19, it is also possible to apply method 3 to bottom layer 23, 23', to add one or two other levels to mould 39, 39'. To avoid overloading the Figures, a single example is detailed below, but it is clear that bottom layer 23, 23' can also be transformed in accordance with the first and second embodiments (with or without the variant) explained above.

The variant remains identical to method 1 described above until step 8, 18 or 20, depending upon the embodiment used. In the example illustrated in FIGS. 14 to 19, we will take the example of the first embodiment, illustrated in triple lines in FIG. 13, as the starting point of the method 1.

Preferably, according to this variant, bottom layer 23 will be etched to form at least a second cavity 35 in mould 39". As can be seen, preferably between FIG. 5 and FIG. 14, a deposition 33 has been made in one part of the first cavity 25 to provide a galvanoplastic start layer. Preferably, this deposition 33 starts at step 5 up to a predetermined thickness. However, this deposition can be performed in accordance with a different method.

As illustrated in double dotted lines in FIG. 13 and FIGS. 14 to 19, the variant of method 1 applies steps 11, 12, 14, 16 and 18 of the second embodiment of method 3 to bottom layer 23.

Figure 15:
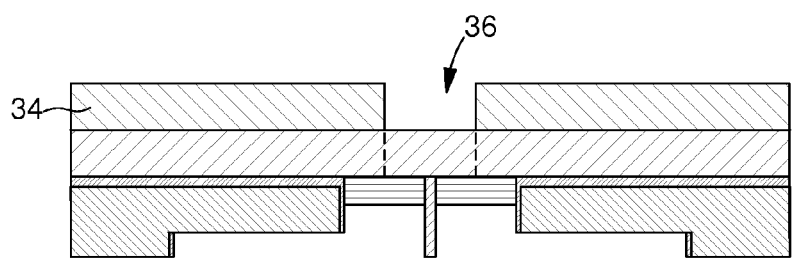

Thus, according to the variant, method 3 includes a new step 11, consisting in structuring at least one mask 34 on the conductive bottom layer 23, as illustrated in FIG. 15. As FIG. 15 also shows, mask 34 includes at least one pattern 36, which does not cover bottom layer 23. This mask 34 can, for example, be obtained by photolithography using a photosensitive resin.

Figure 16:
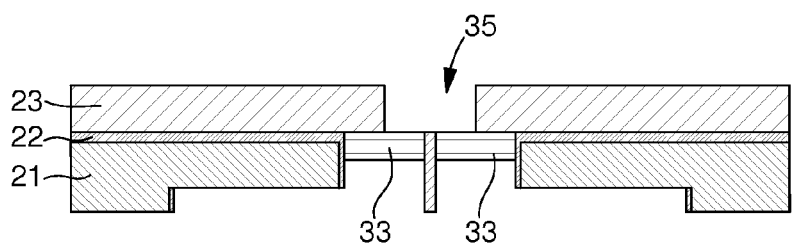

Next, in the new step 12, layer 23 is etched in pattern 36 until the electrically conductive deposition 33 is revealed. Then, protective mask 34 is removed in a new step 14. Thus, as FIG. 16 shows, at the end of step 14, the entire thickness of bottom layer 23 is etched with at least one cavity 35.

Figure 17:
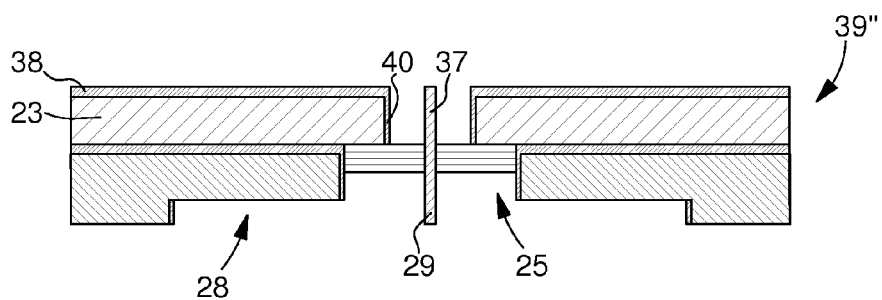

In a new step 16, an electrically insulating coating 38 is deposited, covering the whole of the bottom of substrate 9" as illustrated in FIG. 17. Coating 38 is preferably obtained by depositing a silicon oxide on the top of bottom layer 23, for example, using a vapour phase deposition.

A new step 18 is preferably unnecessary if a single level is added to mould 39". Otherwise, directional etching of coating 38 is performed. The new step 18 would be for limiting the presence of the insulating layer exclusively at each vertical wall 39 formed in bottom layer 23, i.e. the walls of said at least one cavity 35. In our example of FIGS. 14 to 19, a new step 18 is only carried out to remove the oxide layer present in the bottom of said at least one cavity 35.

In the new step 18, as explained previously, a rod 37 can be mounted to form shaft hole 42" in the micromechanical part 41" immediately during galvanoplasty step 5, with the same aforecited advantages.

In the variant of method 1, after step 18, method 3 of fabricating mould 39" ends and method 1 of fabricating the micromechanical part continues with galvanoplasty step 5 and step 7 for releasing part 41" from mould 39". Preferably, if rods 29 and 37 are respectively formed in cavities 25 and 35, they are aligned. Rod 37 is preferably obtained, for example, via a photolithographic method using a photosensitive resin.

Figure 18:
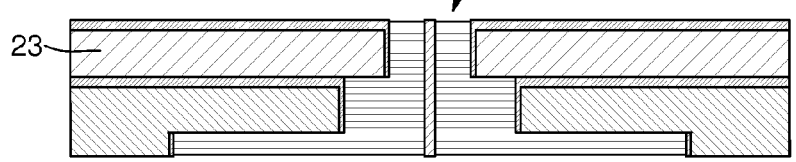

After new steps 8, 18 or 20, galvanoplasty step 5 is performed by connecting the deposition electrode to bottom layer 23 to grow an electrolytic deposition in cavity 35, but also to continue the growth of the deposition in cavity 25, then, exclusively in a second phase, in recess 28, as illustrated in FIG. 18. Fabrication method 1 ends with step 7, in which part 41" is released from mould 39", as explained above.

Figure 19:
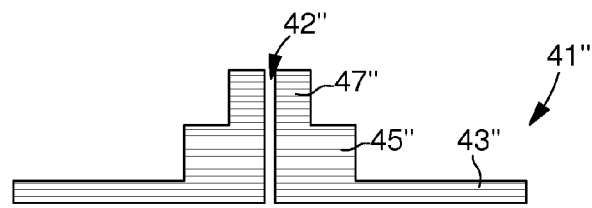

According to this variant, it is clear, as illustrated in FIG. 19, that the micromechanical part 41" obtained has at least three levels 43", 45" and 47", each of different shape and perfectly independent thickness with a single shaft hole 42".

This micromechanical part could, for example, be a coaxial escape wheel 43", 45" with its pinion 47", or a wheel set with three levels of teeth 43", 45", 47" with geometrical precision of the order of a micrometer, but also ideal referencing, i.e. perfect positioning between said levels.

Of course, the present invention is not limited to the example illustrated, but is open to various alterations and variants which will be clear to those skilled in the art. Thus, several moulds 39, 39', 39" are fabricated on the same substrate 9, 9', 9" to achieve series fabrication of micromechanical parts 41, 41', 41", which are not necessarily identical to each other. Likewise, one could envisage changing silicon-based materials for crystallised alumina or crystallised silica or silicon carbide.

What is claimed is:

1. A mould for fabricating a micromechanical part by galvanoplasty, the mould comprising:
    (a) a substrate that includes
        (i) a top layer;
        (ii) a bottom layer, wherein the top layer and the bottom layer are made of doped crystalline silicon, electrically conductive; and
        (iii) an electrically insulating intermediate layer, wherein the top layer and the bottom layer are secured to each other by the electrically insulating intermediate layer,
    wherein the top layer includes at least one cavity that reveals part of the bottom layer of the substrate, and wherein the at least one cavity includes a plurality of vertical walls,
    wherein an electrically insulating layer of silicon dioxide is disposed on the plurality of vertical walls, but not on horizontal walls of the cavity, enabling an electrolytic deposition to be grown in the at least one cavity of the top layer.

2. The mould according to claim 1, wherein the top layer also has at least one recess that communicates with the at least one cavity, and wherein the at least one recess has a plurality of walls, wherein the plurality of walls of the at least one recess comprises vertical walls, wherein with regard to the at least one recess only the vertical walls, but not horizontal walls, have an electrically insulating layer of silicon dioxide disposed thereon, thereby enabling further electrolytic deposition in the at least one recess.

3. The mould according to claim 1, wherein the bottom layer has at least one cavity that reveals part of the electrically insulating layer of the substrate, and wherein the at least one cavity in the bottom layer has a plurality of walls, wherein the plurality of walls of the at least one cavity in the bottom layer comprises vertical walls, wherein with regard to the at least one cavity in the bottom layer only the vertical walls, but not horizontal walls, have an electrically insulating layer of silicon dioxide disposed thereon, thereby enabling an electrolytic deposition to be grown in the at least one cavity of the bottom layer.

4. The mould according to claim 3, wherein the bottom layer also includes at least one recess that communicates with the at least one cavity of the bottom layer, and wherein the at least one recess of the bottom layer has a plurality walls, wherein the plurality of walls of the at least one recess of the bottom layer comprises vertical walls, wherein with regard to the vertical walls of the at least one recess of the bottom layer, only the vertical walls, not the horizontal walls, have an electrically insulating layer of silicon dioxide disposed thereon.

5. The mould according to claim 1, wherein a part made of silicon and mounted onto the top layer, has a least one recess that communicates with the at least one cavity, and wherein the at least one recess comprises a plurality of walls, wherein the plurality of walls of the at least one recess comprises vertical walls, wherein with regard to the at least one recess an electrically insulating layer of silicon dioxide is only disposed on the vertical walls, but not on the horizontal walls, thereby enabling electrolytic deposition in the at least one recess.

6. The mould according to claim 1, wherein a part made of an electrically insulating material is mounted onto the top layer and has at least one recess that communicates with the at least one cavity, and wherein the at least one recess comprises a plurality of walls, wherein the plurality of walls of the at least one recess comprises vertical walls made of the electrically insulating material, thereby enabling further the electrolytic deposition in the at least one recess.

* * * * *